United States Patent [19]
Yoo

[11] Patent Number: 5,898,609
[45] Date of Patent: Apr. 27, 1999

[54] FERROELECTRIC MEMORY HAVING CIRCUIT FOR DISCHARGING PYROELECTRIC CHARGES

[75] Inventor: In-kyeong Yoo, Suwon, Rep. of Korea

[73] Assignee: Samsung Electronics Co., Ltd., Suwon, Rep. of Korea

[21] Appl. No.: 09/086,489

[22] Filed: May 29, 1998

[51] Int. Cl.$^6$ .................................................. G11C 11/22
[52] U.S. Cl. ........................ 365/145; 365/148; 365/149
[58] Field of Search ................................... 365/145, 148, 365/149, 102

[56] References Cited

U.S. PATENT DOCUMENTS 5,574,679  11/1996  Ohtsuki et al. ........................ 365/145

Primary Examiner—David Nelms
Assistant Examiner—David Lam
Attorney, Agent, or Firm—Rothwell, Figg, Ernst & Kurz

[57] ABSTRACT

A ferroelectric random access memory having a discharge circuit for stably discharging pyroelectric charges generated in a ferroelectric capacitor without affecting write and read operations is provided. In the ferroelectric random access memory having the discharge circuit according to the present invention, the pyroelectric charges between the ferroelectric capacitor and the FET of the memory cell, generated during the write and read operations are automatically discharged through a resistor since the resistor is included as a discharge path between the contact point of the ferroelectric capacitor and the FET of the memory unit cell and the grounding point. Accordingly, the function of turning on and off the discharge path for discharging the pyroelectric charges is not necessary and the polarization turbulence due to the pyroelectric charges is not generated.

14 Claims, 6 Drawing Sheets

FERROELECTRIC MEMORY HAVING CIRCUIT FOR DISCHARGING PYROELECTRIC CHARGES

BACKGROUND OF THE INVENTION

1. Field of the Invention

The present invention relates to a ferroelectric memory having a circuit for stably discharging pyroelectric charges generated in a ferroelectric capacitor without affecting write and read operations.

2. Description of the Related Art

It is well known that a ferroelectric material has a pyroelectric effect wherein electric charges are generated on the ferroelectric material by a change in temperature. The pyroelectric effect of ferroelectric material should be low to enabled desired memory characteristics in a ferroelectric memory. The amount of pyroelectric charge generated when the ferroelectric material is heated, is determined according to the heating rate. When there is no circuit through which pyroelectric charges are discharged, a back voltage is generated, thus switching the polarization. Therefore, a ferroelectric material having a low pyroelectric effect is required. A pyroelectric coefficient p is determined by the dielectric constant c and the amount of polarization Ps of the ferroelectric material as follows.

$-p = \epsilon \beta Ps$ wherein, $\beta$ is a constant determined by the properties of the material. The pyroelectric coefficient, in general, has direction opposite to that of the polarization of the ferroelectric material since an atomic displacement direction during the polarization of the material is opposite to that during generation of the pyroelectric charges.

This can disturb the polarization characteristics of the ferroelectric material used to store information in a ferroelectric memory. For example, during the fabrication of a ferroelectric memory device, when the ferroelectric material generates pyroelectric charges in a certain thermal fluctuation environment, the charges may permanently affect the polarization, thus deteriorating the function of the memory.

FIG. 1a is a circuit diagram of a conventional ferroelectric random access memory unit cell. As shown in FIG. 1a, the unit cells of the conventional ferroelectric random access memory have a structure in which a ferroelectric capacitor 2 is connected to the source of a field effect transistor (FET) 1. Information is stored by generating a polarity in the ferroelectric material by a voltage applied to the ferroelectric capacitor 2 by the switching operation of the FET 1 and information is read by reading the voltage generated by the polarization of the ferroelectric capacitor 2. However, in the ferroelectric random access memory having the above structure, the ferroelectric material generates pyroelectric charges when information is stored or read, as shown in FIG. 1b. When there is no path through which the pyroelectric charges can be discharged, the pyroelectric charges are diffused to the source of the FET 1. The pyroelectric charges cannot be discharged because of the p-n junction source and thus accumulate. The accumulated pyroelectric charges generate a back voltage in the FET 1, thus switching the polarization and deteriorating the function of the memory.

A ferroelectric random access memory in which a path 3 for discharging pyroelectric charges generated in the ferroelectric capacitor 2 to ground has been provided in order to solve the pyroelectric charge problem, as shown in FIG. 2. A ferroelectric random access memory having a pyroelectric charge discharging path 3 has an advantage that a back voltage is formed by the pyroelectric charges. However, the path must be temporarily disrupted when information is stored in or read from the ferroelectric capacitor 2.

SUMMARY OF THE INVENTION

To solve the above problem(s), it is an objective of the present invention to provide a ferroelectric random access memory having a discharge circuit for discharging pyroelectric charges in which it is not necessary to disrupt a discharge path when information is stored or read.

Accordingly, to achieve the above objective, there is provided a ferroelectric memory, comprising a ferroelectric capacitor, a transistor connected to the ferroelectric capacitor, a circuit for discharging pyroelectric charges formed in the ferroelectric capacitor, wherein one terminal of the circuit is connected to a gate of the transistor and the other terminal of the circuit is connected to a node between the transistor and the ferroelectric capacitor.

In the present invention, the discharging circuit is preferably a capacitor having a capacitance such as to distribute pyroelectric charges from a p-n junction of the transistor and to prevent the creation of a back voltage formed by pyroelectric charges accumulated on the p-n junction to switch the polarization in transistor. And the circuit is preferably inserted between the bottom electrode of the ferroelectric capacitor and the gate of the transistor in form of a layer which is formed of a dielectric material.

According to another embodiment of the present invention, there is provided a ferroelectric memory, comprising a ferroelectric capacitor, a transistor connected to the ferroelectric capacitor, and a circuit for discharging pyroelectric charges formed in the ferroelectric capacitor, wherein a terminal of the discharging circuit is connected to a contact node between the transistor and the ferroelectric capacitor, and the other terminal of the discharge circuit is grounded.

In the present invention, the circuit is preferably formed of a field oxide layer which has a capacitance such as to distribute pyroelectric charges from a p-n junction of the transistor and prevents creation of a back voltage which is formed by pyroelectric charges accumulated on the p-n junction of the transistor.

BRIEF DESCRIPTION OF THE DRAWING(S)

The above objectives and advantages of the present invention will become more apparent by describing in detail a preferred embodiment thereof with reference to the attached drawings in which:

FIG. 1b is a diagram for describing the formation of a back voltage by pyroelectric charges of the ferroelectric capacitor generated in the circuit of FIG. 1a;

DESCRIPTION OF THE PREFERRED EMBODIMENT(S)

Figure 3A:
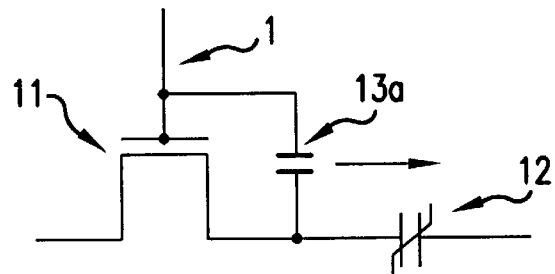
FIGS. 3a through 3c are circuit diagrams of a random access memory unit cell having a discharge circuit for discharging pyroelectric charges according to the present invention.
Figure 3B:
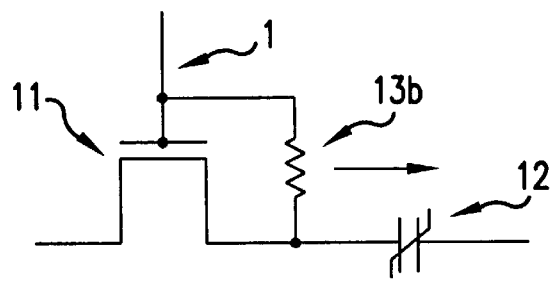
Figure 3C:
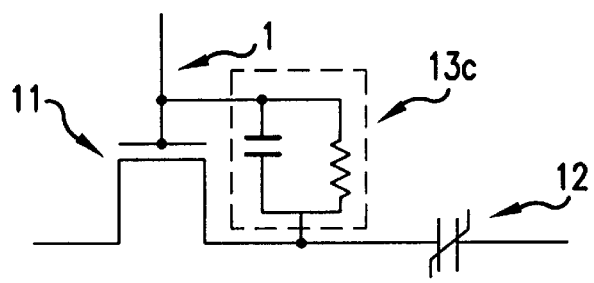

FIGS. 3a through 3c are circuit diagrams of a memory (such as a random access memory) unit cell having a circuit for discharging pyroelectric charges according to the present invention. As shown in FIGS. 3a through 3c, in the random access memory having a discharge circuit according to the present invention, circuits formed by a capacitor 13a, a resistor 13b, or a capacitor and resistor in parallel 13c are connected to the word line 1 (or gate) of an FET 11, as a discharge path. Namely, the RAM is formed from the combination of a plurality of unit cells including a ferroelectric capacitor 12 for storing information using a polarization phenomenon, an FET 11 connected to the ferroelectric capacitor 12 as switching means for storing (recording) the information by generating polarity by applying a voltage to the ferroelectric capacitor 12 or reading the recorded information by detecting a polarization charge from the ferroelectric capacitor 12, and a capacitor 13a, a resistor 13b, or a capacitor and resistor parallel circuit 13c (discharge circuit) for discharging the pyroelectric charges formed between the p-n junction of the FET 11 and the ferroelectric capacitor 12, regardless of the type of operation.

Figure 4:
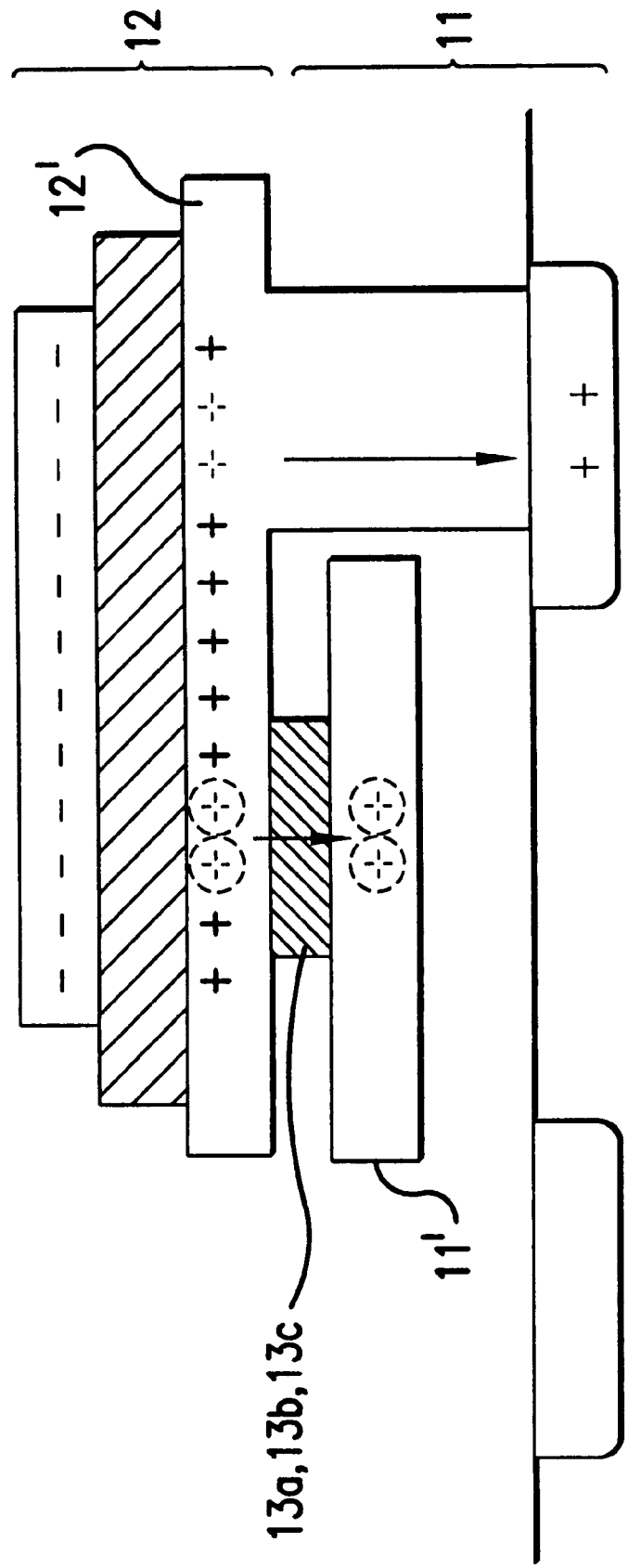
FIG. 4 is a sectional view of a random access memory having a discharge circuit for discharging pyroelectric charges according to FIGS. 3a through 3c.

The capacitor 13a, the resistor 13b, or the capacitor and resistor parallel circuit 13c as the discharge circuit are realized by building up a dielectric layer 13a or a resistive layer 13b between a lower electrode 12' of the ferroelectric capacitor 12 connected to the source of the FET 11 and the gate 11' of the FET 11, as shown in FIG. 4. In the random access memory having the discharge circuit having the above structure, as shown in FIG. 4, the pyroelectric charges generated in the ferroelectric capacitor are discharged through the capacitor 13a, the resistor 13b, or the capacitor and resistor parallel circuit 13c, respectively. Accordingly, the pyroelectric charges accumulated on the p-n junction of the source of the FET 11 are distributed and reduced, thus suppressing the formation of a back voltage. The dielectric layer 13a has a capacitance such as to distribute pyroelectric charges from the p-n junction of the FET 11 and does not cause the back voltage which is formed by pyroelectric charges accumulated on the p-n junction which would switch the FET 11. The resistive layer 13b has a resistance such as to distribute pyroelectric charges from the p-n junction of the FET 11 and does not cause the back voltage which is formed by pyroelectric charges accumulated on the p-n junction to switch the FET 11. Also, The dielectric and resistive layer 13c has a capacitance and resistance such as to distribute pyroelectric charges from the p-n junction of the FET 11 and does not cause the back voltage which is formed by pyroelectric charges accumulated on the p-n junction to switch the FET 11. A detailed operation will be described later since it is similar to that of another embodiment which will be described below.

Figure 1A:
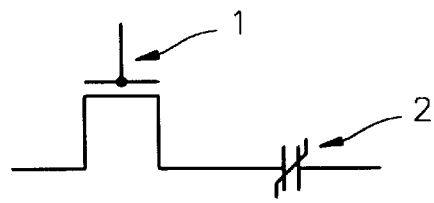
FIG. 1a is a circuit diagram of a conventional ferroelectric random access memory unit cell.
Figure 1B:
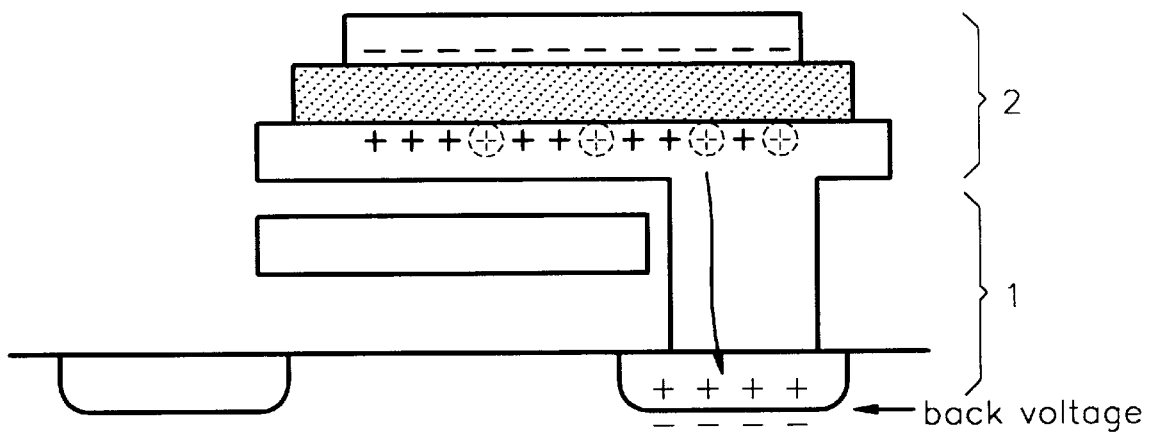
Figure 2:
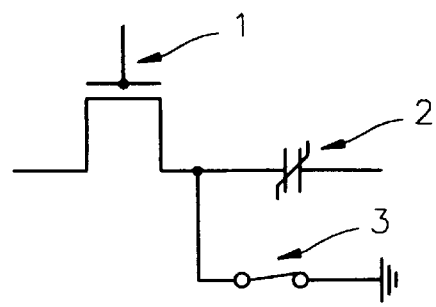
FIG. 2 is a circuit diagram of a conventional ferroelectric random access memory unit cell having a discharge path.
Figure 5A:
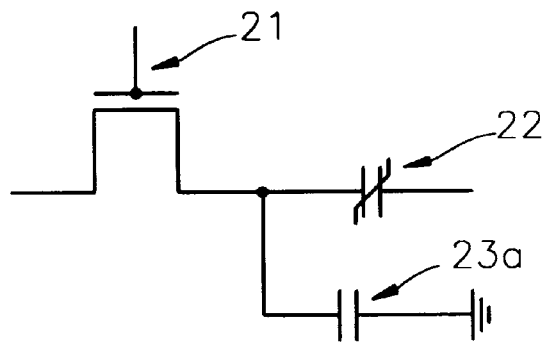
FIGS. 5a through 5c are circuit diagrams of a random access memory unit cell having a discharge circuit for discharging pyroelectric charges according to another embodiment of the present invention.
Figure 5B:
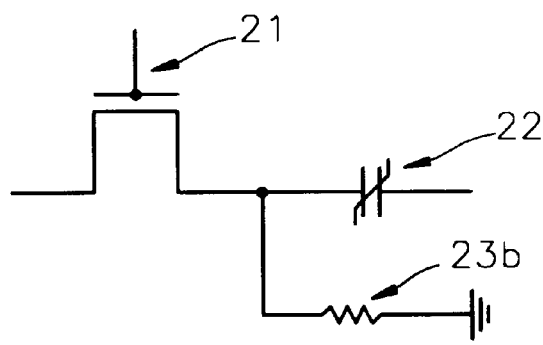
Figure 5C:
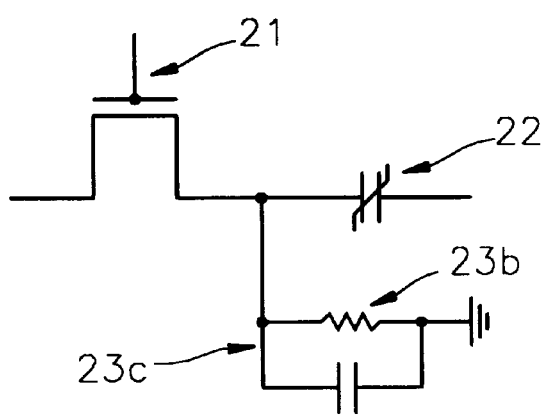

FIGS. 5a through 5c are circuit diagrams of a memory (such as a random access memory) unit cell having a discharge circuit according to another embodiment of the present invention. As shown in FIGS. 5a through 5c, in the random access memory having the discharge circuit according to this embodiment of the present invention, the capacitor circuit 23a, the resistor circuit 23b, or the capacitor and resistor parallel circuit 23c are formed as the discharge path instead of the switched discharge path to ground (as shown in FIG. 2). Namely, the memory (RAM) is formed from the combination of a plurality of unit cells including a ferroelectric capacitor 22 for storing the information using the polarization phenomenon, an FET 21 connected to the ferroelectric capacitor 22 as the switching means for storing (recording) information by generating a polarity by applying a voltage to the ferroelectric capacitor 22 or reading the recorded information by detecting the polarization charge from the ferroelectric capacitor 22, and the capacitor 23a, the resistor 23b, or the capacitor and resistor parallel circuit 23c for discharging the pyroelectric charges formed between the p-n junction of the FET 21 and the ferroelectric capacitor 22, regardless of the type of operation.

Figure 6:
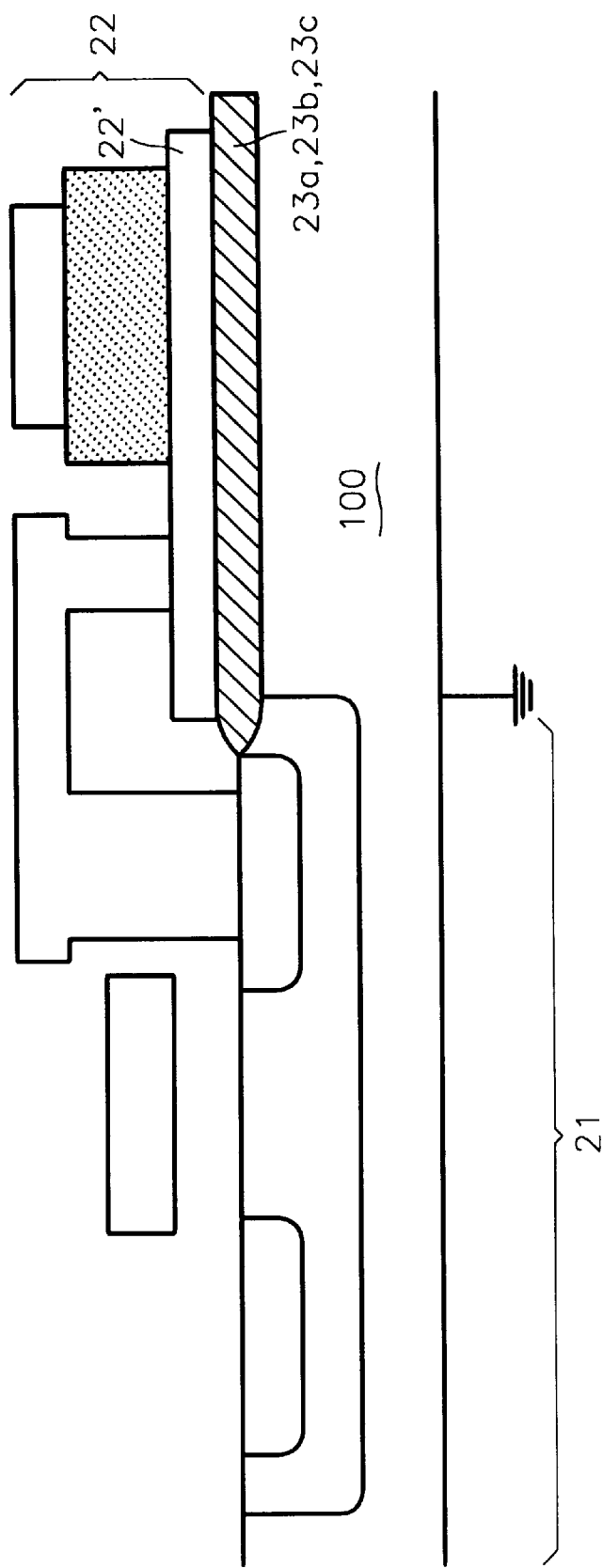
FIG. 6 is a sectional view of a random access memory having a discharge circuit for discharging pyroelectric charges according to FIGS. 5a through 5c.

The capacitor 23a, the resistor 23b, or the capacitor and resistor parallel circuit 23c are formed by building up an insulation layer between a lower electrode 22' of the ferroelectric capacitor 22 connected to the source of the FET 21 and a substrate 100. It is desired that, as an insulation layer, a field oxide layer 23a, 23b and 23c is used as shown in FIG. 6. A field oxide layer can be formed to a dielectric layer 23a or a resistive layer 23b or a dielectric and resistive layer 23c according to a using material. The dielectric layer 23a, the resistive layer 23b, or an oxide layer 23b having a dielectric characteristic and resistivity is simply formed by oxidizing the upper portion of the substrate 100, with the substrate 100 being grounded. In other words, a field oxide layer has such capacitance or resistance so as to distribute pyroelectric charges from a p-n junction of the transistor and does not cause the back voltage which is formed by pyroelectric charges stored in the p-n junction to switch the transistor, or has such capacitance and resistance so as to distribute pyroelectric charges from a p-n junction of the transistor and does not cause the back voltage which is formed by pyroelectric charges stored in the p-n junction to switch the transistor.

Figure 7A:
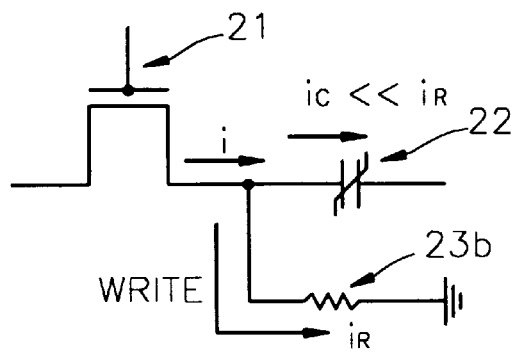
FIGS. 7a through 7c are circuit diagrams for describing the operations of a random access memory unit cell having a discharge circuit for discharging pyroelectric charges according to FIG. 5b.
Figure 7B:
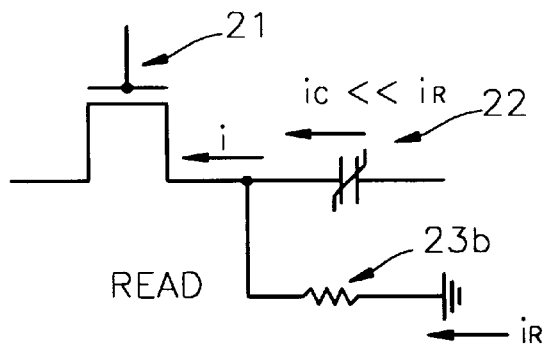
Figure 7C:
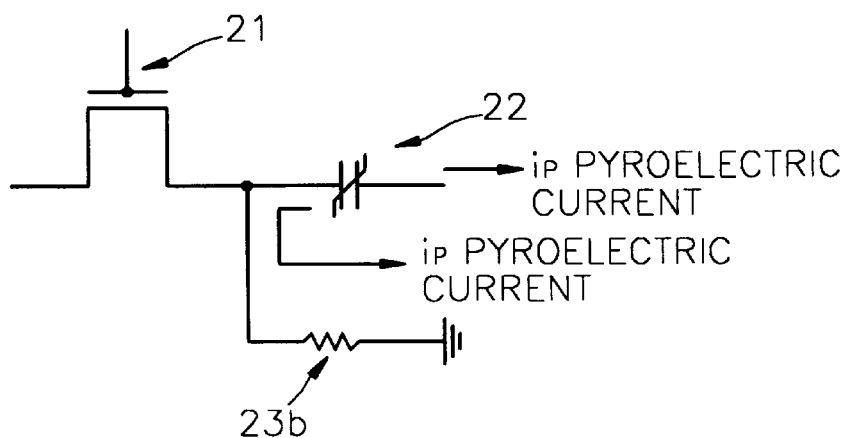

The operation of the random access memory unit cell having the discharge circuit having the above structure is shown in FIGS. 7a through 7c. The operation will be described on the basis of the random access memory in which a resistor is used as the discharge means as shown in FIG. 5b. In the random access memory having the discharge circuit according to the present invention, it is not necessary to interrupt a discharge circuit when the information is stored or read, performing the write operation shown in FIG. 7a and the read operation shown in FIG. 7b. This is because the voltage load between the ends of the ferroelectric capacitor 22 is equal to the voltage load at the ends of the resistor 23, current $i_C$ flowing through the ferroelectric capacitor 22 is small, and most current $i_R$ flows to the resistor 23 and does not affect the polarization of the capacitor (namely, $i_C < i_R$). Since the resistivity of the resistor 23 is much smaller than the resistivity of the ferroelectric capacitor 22, the pyroelectric charges $i_P$ between the ferroelectric capacitor 22 and the FET 21 of the memory cell generated during the write and read operations are automatically discharged through the resistor 23, as shown in FIG. 7c. Wiring having resistive elements or other resistors can be used as the resistor 23. The resistance value is determined considering the polarization value (or the capacitance of the ferroelectric capacitor) of the ferroelectric (KΩ or MΩ order). Therefore, a function of turning on and turning off the discharge path for discharging the pyroelectric charges is not necessary. Also, a polarization turbulence by the pyroelectric charges is not generated.

As mentioned above, in the ferroelectric random access memory having the discharge circuit, the pyroelectric charges between the ferroelectric capacitor and the FET of the memory cell, generated during the write and read operations are automatically discharged through the resistor since the resistor is included as a discharge path between the contact point of the ferroelectric capacitor and the FET of the memory unit cell and the grounding point. Accordingly, the function of turning on and off the discharge path for discharging pyroelectric charges is not necessary and the polarization turbulence due to the pyroelectric charges is not generated.

What is claimed is:

1. A ferroelectric memory, comprising:

a ferroelectric capacitor;

a transistor connected to the ferroelectric capacitor;

a circuit for discharging pyroelectric charges formed in the ferroelectric capacitor;

wherein one terminal of the circuit is connected to a gate of the transistor and another terminal of the circuit is connected to a node between the transistor and the ferroelectric capacitor.

2. The ferroelectric memory claimed in claim 1, wherein the circuit is a resistor having a resistance in the range of KΩ to MΩ.

3. The ferroelectric memory claimed in claim 1, wherein the circuit includes a capacitor having a capacitance such as to distribute pyroelectric charges from a p-n junction of the transistor and prevents the creation of back voltage formed by pyroelectric charges accumulated on the p-n junction of the transistor.

4. The ferroelectric memory claimed in claim 1, wherein the circuit includes a parallel arrangement of a resistor and capacitor, having a capacitance and resistance such as to distribute pyroelectric charges from a p-n junction of the transistor and prevents the creation of back voltage formed by pyroelectric charges accumulated on the p-n junction of the transistor.

5. The ferroelectric memory claimed in claim 1, wherein said circuit is connected between a bottom electrode of said ferroelectric capacitor and said gate of the transistor in the form of a layer of material.

6. The ferroelectric memory claimed in claim 5, wherein the layer is formed of a resistive material.

7. The ferroelectric memory claimed in claim 5, wherein the layer is formed of a dielectric material.

8. The ferroelectric memory claimed in claim 5, wherein the layer is formed of a resistive and dielectric material.

9. A ferroelectric memory, comprising:

a ferroelectric capacitor;

a transistor connected to the ferroelectric capacitor;

a circuit for discharging pyroelectric charges formed in the ferroelectric capacitor, wherein one terminal of said circuit is connected to a contact node of the transistor and the ferroelectric capacitor, and another terminal of the discharge circuit is grounded and said circuit does not include a switch.

10. The ferroelectric memory claimed in claim 9, wherein the circuit is formed of an insulation layer.

11. The ferroelectric memory claimed in claim 10, wherein a field oxide layer is used as the insulation layer.

12. The ferroelectric memory claimed in claim 11, wherein the field oxide layer has a capacitance such as to distribute pyroelectric charges from a p-n junction of the transistor and prevents the creation of back voltage formed by pyroelectric charges accumulated on the p-n junction of the transistor.

13. The ferroelectric memory claimed in claim 11, wherein the field oxide layer has a resistance in the range of KΩ to MΩ.

14. The ferroelectric memory claimed in claim 11, wherein the field oxide layer has a capacitance and resistance such as to distribute pyroelectric charges from a p-n junction of the transistor and prevents the creation of back voltage formed by pyroelectric charges accumulated on the p-n junction of the transistor.

* * * * *